US012583739B2

(12) United States Patent
Dan et al.

(10) Patent No.: US 12,583,739 B2
(45) Date of Patent: Mar. 24, 2026

(54) MEMS SPEAKER

(71) Applicant: AAC Kaitai Technologies (Wuhan) CO., LTD., Hubei (CN)

(72) Inventors: Qiang Dan, Wuhan (CN); Linxin Zhang, Wuhan (CN); Yufen Chu, Wuhan (CN); Yao Hui, Wuhan (CN); Yang Li, Wuhan (CN)

(73) Assignee: AAC Kaitai Technologies (Wuhan) CO., LTD., Wuhan (CN)

( * ) Notice: Subject to any disclaimer, the term of this patent is extended or adjusted under 35 U.S.C. 154(b) by 137 days.

(21) Appl. No.: 18/764,396

(22) Filed: Jul. 5, 2024

(65) Prior Publication Data

US 2025/0250162 A1     Aug. 7, 2025

Related U.S. Application Data

(63) Continuation of application No. PCT/CN2024/075202, filed on Feb. 1, 2024.

(51) Int. Cl.
*B81B 7/00* (2006.01)

(52) U.S. Cl.
CPC .... *B81B 7/0061* (2013.01); *B81B 2201/0257* (2013.01); *B81B 2203/0127* (2013.01); *B81B 2203/0353* (2013.01)

(58) Field of Classification Search
CPC .......... B81B 7/0061; B81B 2201/0257; B81B 2203/0127; B81B 2203/0353; H04R 19/005; H04R 2201/003
See application file for complete search history.

(56) References Cited

U.S. PATENT DOCUMENTS

| | | | | |
|---|---|---|---|---|
| 9,955,268 B2 * | 4/2018 | Hsieh | ................. | H04R 23/006 |
| 2017/0347185 A1 * | 11/2017 | Kim | ..................... | H04R 19/04 |
| 2020/0039817 A1 * | 2/2020 | Zou | ..................... | H04R 1/04 |
| 2020/0213690 A1 * | 7/2020 | Meng | ................. | H04R 19/005 |
| 2023/0063234 A1 * | 3/2023 | Chen | ..................... | H04R 7/04 |
| 2024/0034620 A1 * | 2/2024 | Chang | ................. | B81B 7/0077 |

FOREIGN PATENT DOCUMENTS

| | | | | | |
|---|---|---|---|---|---|
| EP | | 1992589 A2 * | 11/2008 | ........... | B81B 7/0061 |
| KR | | 20140121081 A * | 10/2014 | ........... | H04R 19/005 |

* cited by examiner

*Primary Examiner* — David L Ton
(74) *Attorney, Agent, or Firm* — Wiersch Law Group

(57) ABSTRACT

The present disclosure provides a MEMS speaker including a supporting member, a diaphragm used for emitting an amplitude-modulated ultrasonic wave, and an acoustic valve. The supporting member includes a supporting body and an acoustic hole, the acoustic valve includes a valve body fixed with a peripheral side of the supporting body and located in the acoustic hole and a variable section valve hole permeating from one end of the valve body to the other end thereof, the diaphragm is fixed with an inner peripheral side of the supporting body and located in the acoustic hole, the variable section valve hole allows the amplitude-modulated ultrasonic wave passing through the variable section valve hole to produce a modulated acoustic wave. Compared with the related art, the MEMS speaker could enhance the efficiency and amplitude of acoustic wave demodulation, and the acoustic performance could be enhanced.

10 Claims, 12 Drawing Sheets

100

A-A air space a variable
section
valve hole boundary of a
variable section
valve hole wall apply
pressure
source

FIG. 8 a variable
section valve
hole in the
present
disclosure acoustic wave a valve
hole in the
prior art acoustic wave

MEMS SPEAKER

FIELD OF THE INVENTION

The invention relates to the technical field of electro-acoustic conversion technology, in particular to a MEMS speaker.

BACKGROUND

Speaker is a transducer device that transforms an electrical signal into an acoustic signal. Speakers are widely used in portable mobile electronic products, such as cell phones, tablet PCs, etc., for converting audio signals into sound for playback, and the miniaturization of portable mobile electronic products has driven the miniaturization of speakers to become more and more widespread. The sound pressure level (SPL) and harmonic distortion (THD) of a speaker are important indicators of acoustic performance.

The speaker of the related technology comprises a supporting member, a diaphragm fixed in the supporting member for emitting symmetrical ultrasonic waves, and a baffle plate spaced apart on a side of the supporting member away from the ultrasonic vibration sound generating unit, there is a through hole permeating from a side of the supporting member close to the baffle plate, the baffle plate is spaced apart from the supporting member for forming a narrow slit communicating with the through hole, whereas the narrow slit is extremely nonlinear, the symmetrical ultrasonic waves passing through the narrow slit will cause distortion, which will demodulate an audible sound. However, the efficiency of the diaphragm to demodulate the audible sound through the narrow slit is too slow, the amplitude is too low, the acoustic performance is too poor.

Therefore, it is desired to provide an improved MEMS speaker module to solve the problems above.

SUMMARY

The present disclosure is to provide a MEMS speaker which could enhance the efficiency, amplitude of acoustic wave demodulation, and the acoustic performance.

For achieving the object mentioned above, the present disclosure provides a MEMS speaker including a supporting member, a diaphragm used for emitting an amplitude-modulated ultrasonic wave, and an acoustic valve, the supporting member includes a supporting body and an acoustic hole permeating from one end of the supporting body to the other end thereof, the acoustic valve includes a valve body fixed with a peripheral side of the supporting body and located in the acoustic hole and a variable section valve hole permeating from one end of the valve body to the other end thereof, the diaphragm is fixed with an inner peripheral side of the supporting body and located in the acoustic hole, the variable section valve hole allows the amplitude-modulated ultrasonic wave passing through the variable section valve hole to produce a modulated acoustic wave.

Further, an inner diameter of the variable section valve hole changes constantly which makes a bidirectional flow resistance exhibit a non-reciprocal effect.

Further, the non-reciprocal effect of the variable section valve hole makes a symmetrical amplitude-modulated ultrasonic wave passing through the variable section valve hole come out as an asymmetric sound wave, the asymmetric sound wave comprises the modulated acoustic wave.

Further, a cross-sectional shape of the variable section valve hole is a V-shaped structure with an angle of 1°-89°.

Further, the variable section valve hole is in a multi-layer step-type structure.

Further, the variable section valve hole is provided with a curved inner wall.

Further, there is a plurality of variable section valve holes, the plurality of variable section valve holes is spaced apart from the valve body.

Further, there are a plurality of acoustic holes, a plurality of diaphragms and a plurality of acoustic valves, a number of the plurality of acoustic holes is the same as a number of the plurality of the diaphragms and a number of the plurality of the acoustic valves, one of the plurality of the diaphragms is located in each of the acoustic holes, each of the acoustic holes is corresponding with one of the acoustic valves.

Further, the variable section valve hole is located in a mid-portion of the acoustic hole or at one end of the acoustic hole.

Further, an inlet and outlet acoustic axes of the variable section valve hole is perpendicular to a vibration direction of the diaphragm.

BRIEF DESCRIPTION OF THE DRAWINGS

In order to explain the technical solutions of the embodiments of the present disclosure more clearly, accompanying drawings used to describe the embodiments are briefly introduced below. It is evident that the drawings in the following description are only concerned with some embodiments of the present disclosure. For those skilled in the art, in a case where no inventive effort is made, other drawings may be obtained based on these drawings.

FIG. 8 shows a diagram of a two-dimensional axisymmetric model of a first structure of a MEMS speaker provided by an embodiment of the present disclosure;

DESCRIPTION OF THE EMBODIMENTS

Figure 1:
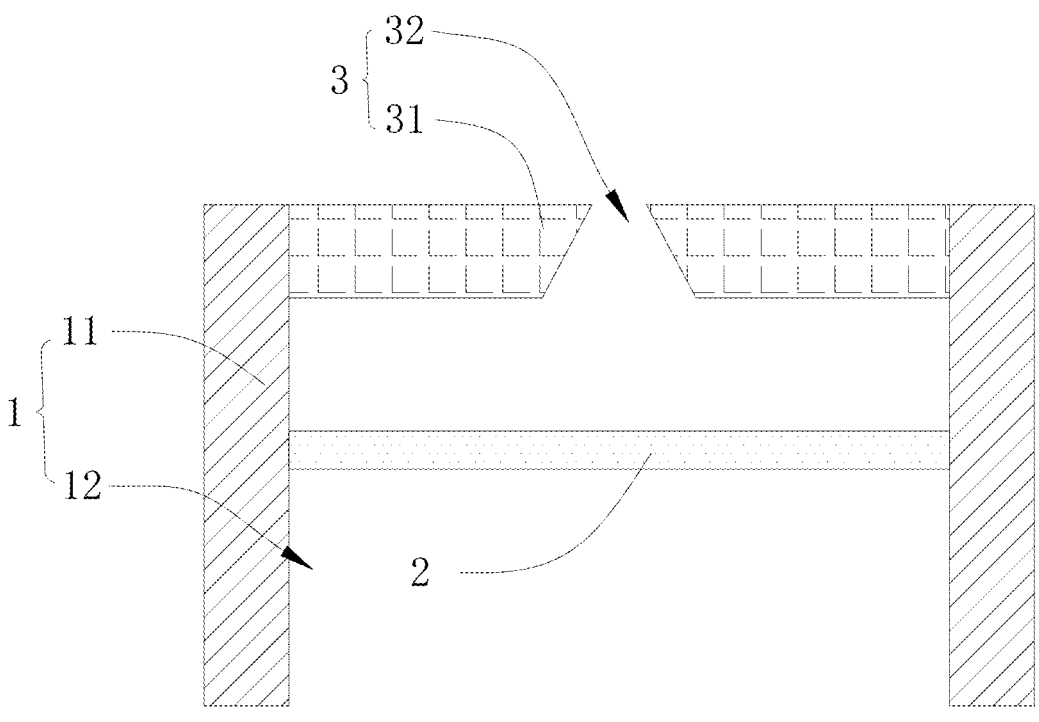
FIG. 1 is a cross-sectional view of a MEMS speaker in accordance with a first embodiment of the present disclosure.

The present disclosure will be further illustrated with reference to the accompanying drawings. It shall be noted that the elements of similar structures or functions are represented by like reference numerals throughout the figures. The embodiments described herein are not intended as an exhaustive illustration or description of various other embodiments or as a limitation on the scope of the claims or the scope of some other embodiments that are apparent to one of ordinary skills in the art in view of the embodiments described in the Application. In addition, an illustrated embodiment need not have all the aspects or advantages shown.

As shown in the FIGS. 1-8. The present invention discloses a MEMS speaker, which includes a supporting member 1, a diaphragm 2 and an acoustic valve 3.

The supporting member 1 includes a supporting body 11 and an acoustic hole 12 permeating from one end of the supporting body 11 to the other end thereof. The diaphragm 2 is fixed with an inner peripheral side of the supporting member 1 and located in the acoustic hole 12, the diaphragm 2 is used for emitting an amplitude-modulated ultrasonic wave. The acoustic valve 3 includes a valve body 31 fixed with a peripheral side of the supporting body 11 and located in the acoustic hole 12 and a variable section valve hole 32 permeating from one end of the valve body 31 to the other end thereof. The variable section valve hole 32 allows the amplitude-modulated ultrasonic wave passing through the variable section valve hole 32 to produce a modulated acoustic wave.

An inner diameter of the variable section valve hole 32 changes constantly which makes a bidirectional flow resistance exhibit a non-reciprocal effect.

The non-reciprocal effect of the variable section valve hole 32 makes a symmetrical amplitude-modulated ultrasonic wave passing through the variable section valve hole 32 come out as an asymmetric sound wave, the asymmetric sound wave includes the modulated acoustic wave.

An inlet and outlet acoustic axes of the variable section valve hole 32 is perpendicular to a vibration direction of the diaphragm 2.

The variable section valve hole 32 is located in a mid-portion of the acoustic hole 12 or at one end of the acoustic hole 12. In this embodiment, the variable section valve hole 32 is located at one end of the acoustic hole 12.

As an optional embodiment of the design of the variable section valve hole 32, as shown in FIG. 1, a diameter of one end of the variable section valve hole 32 close to the diaphragm 2 is larger than a diameter of one end of the variable section valve hole 32 away from the diaphragm 2.

Figure 2:
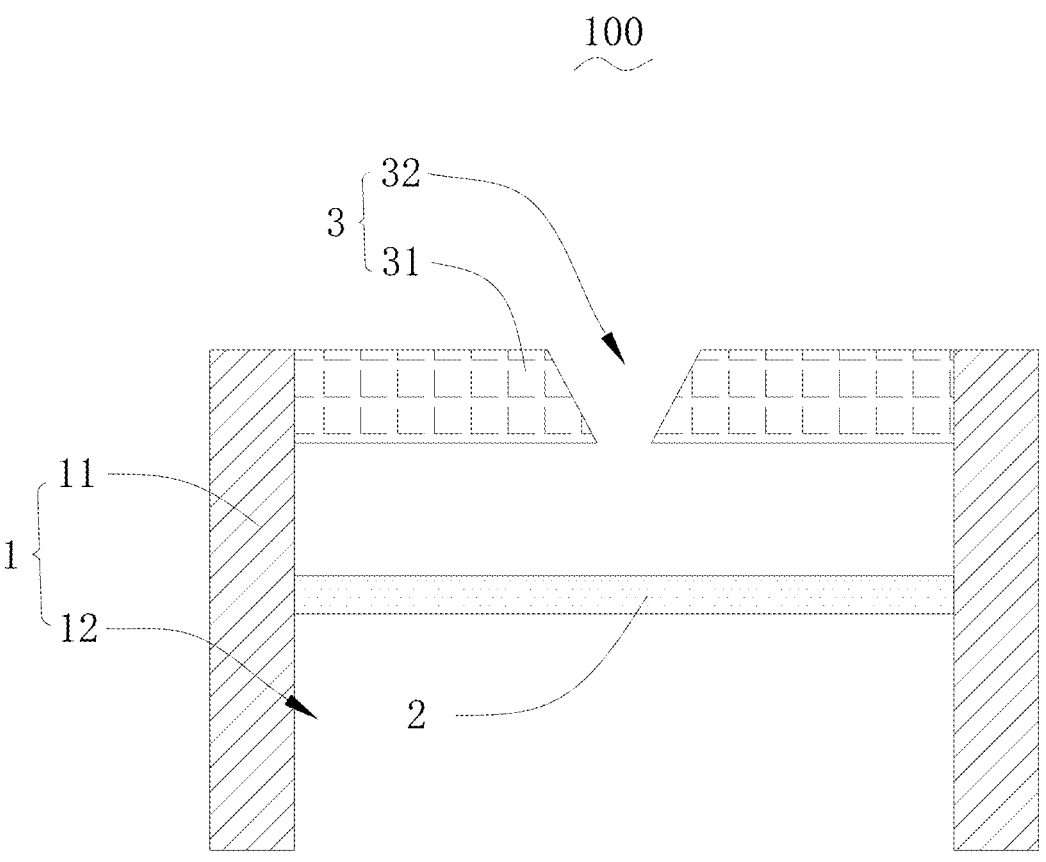
FIG. 2 is a cross-sectional view of a MEMS speaker in accordance with a second embodiment of the present disclosure.

As an optional embodiment of the design of the variable section valve hole 32, as shown in FIG. 2, a diameter of one end of the variable section valve hole 32 away from the diaphragm 2 is larger than a diameter of one end of the variable section valve hole 32 close to the diaphragm 2.

Figure 3:
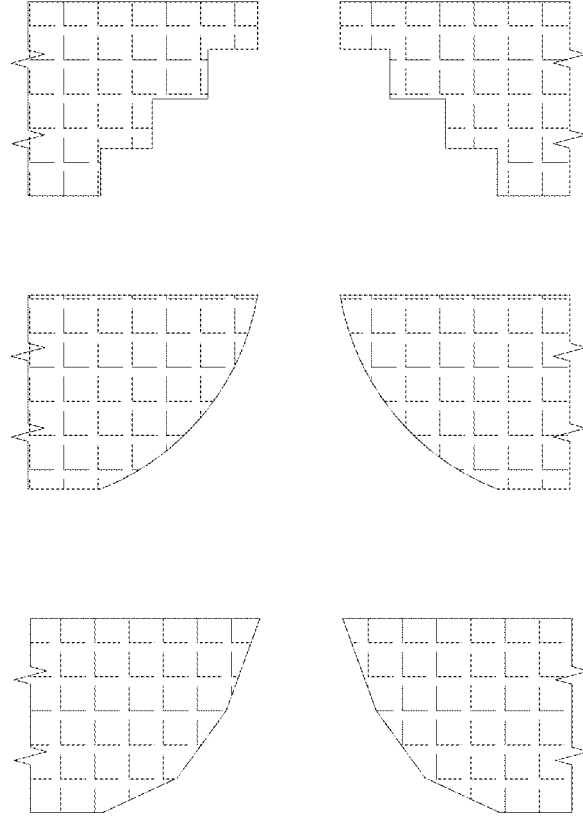
FIG. 3 is a schematic diagram of various configurations of valve holes provided by embodiments of the present invention.
Figure 4:
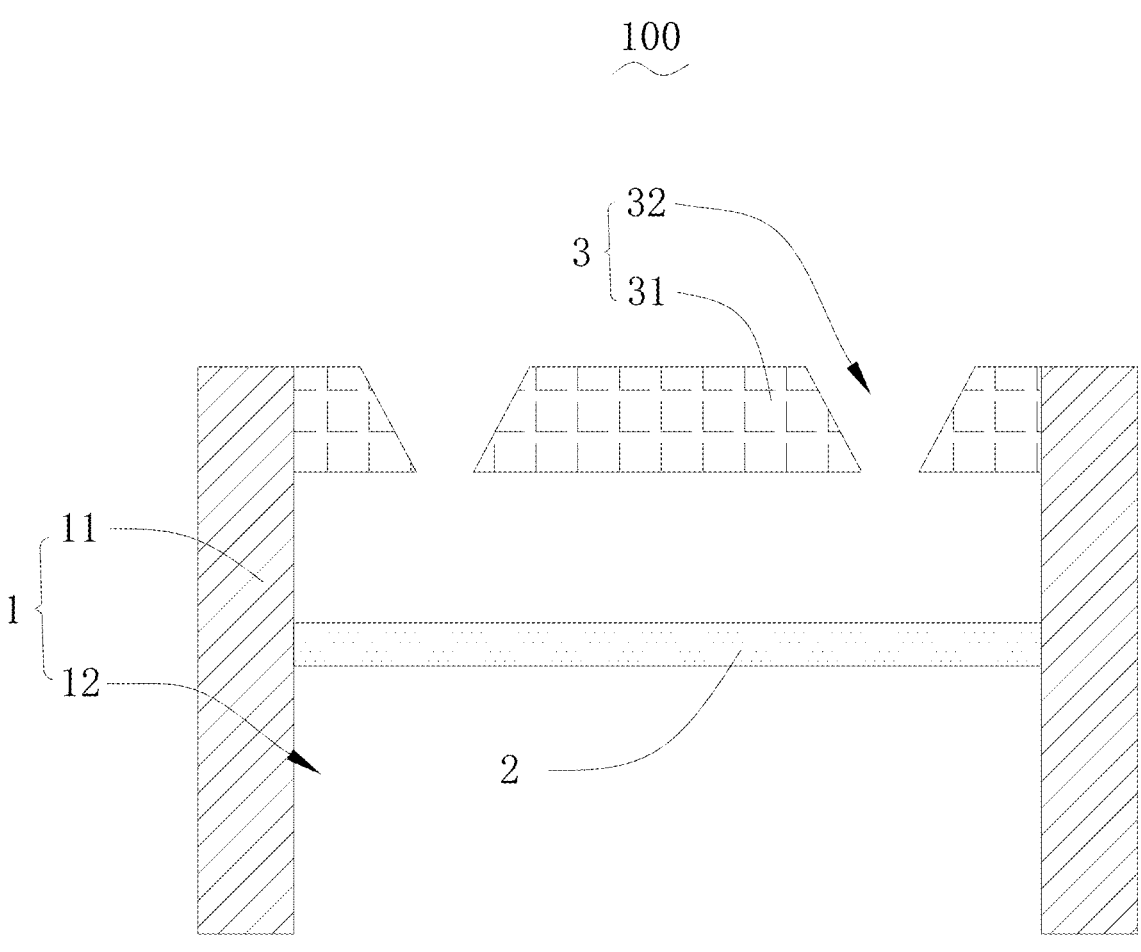
FIG. 4 is a cross-sectional view of a MEMS speaker in accordance with a third embodiment of the present disclosure.

As shown in FIG. 1 and FIG. 3, a cross-sectional shape of the variable section valve hole 32 is a V-shaped structure with an angle of 1°-89°, or the variable section valve hole 32 is in a multi-layer step-type structure, or the variable section valve hole 32 is provided with a curved inner wall, or an inner sidewall of the variable section valve hole 32 is a plurality of segments connected end to end and inclined to form a curved line shape, and an angle of inclination of each inclined section increases in turn.

There is a plurality of variable section valve holes 32, the plurality of variable section valve holes 32 is spaced apart from the valve body 31.

Figure 5:
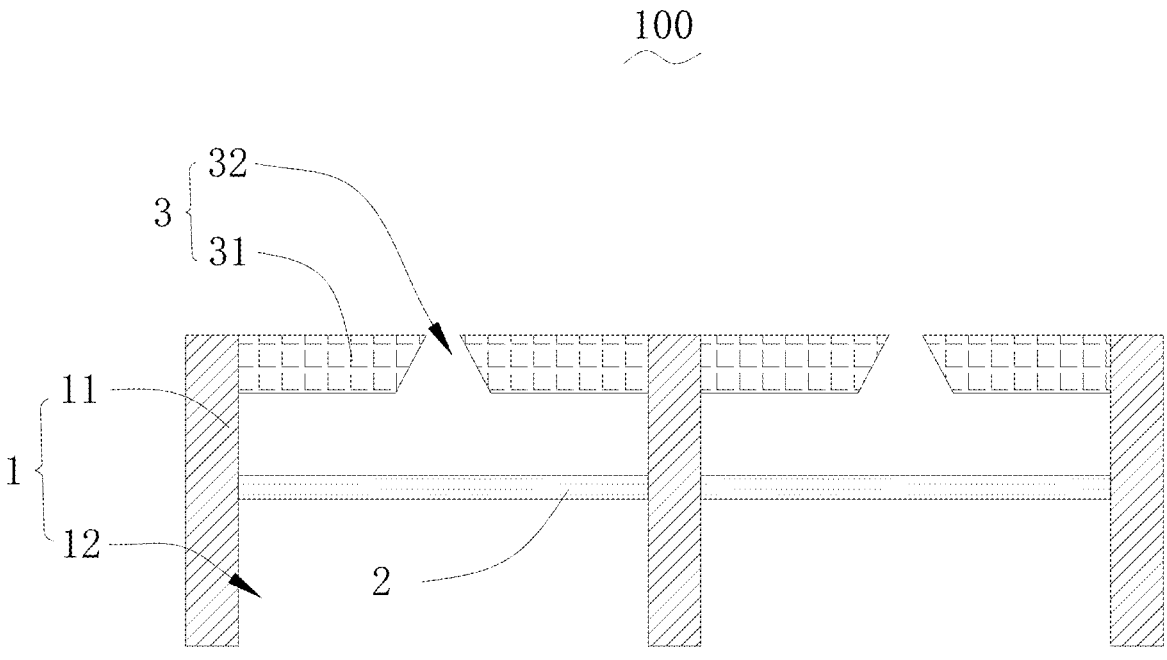
FIG. 5 is a cross-sectional view of a MEMS speaker in accordance with a fourth embodiment of the present disclosure.

As an optional embodiment, as shown in FIG. 5, there are a plurality of the acoustic holes 12, a plurality of the diaphragms 2, and a plurality of the acoustic valve 3, the number of the acoustic holes 12 is the same as the number of the diaphragms 2 and the number of the acoustic valves 3, one of the plurality of the diaphragms 2 is located in each of the acoustic holes 12, each of the acoustic holes 12 is corresponding with one of the acoustic valves 3. Further, each of the plurality of acoustic valves 3 is located at the same end of the plurality of acoustic holes 12.

Figure 6:
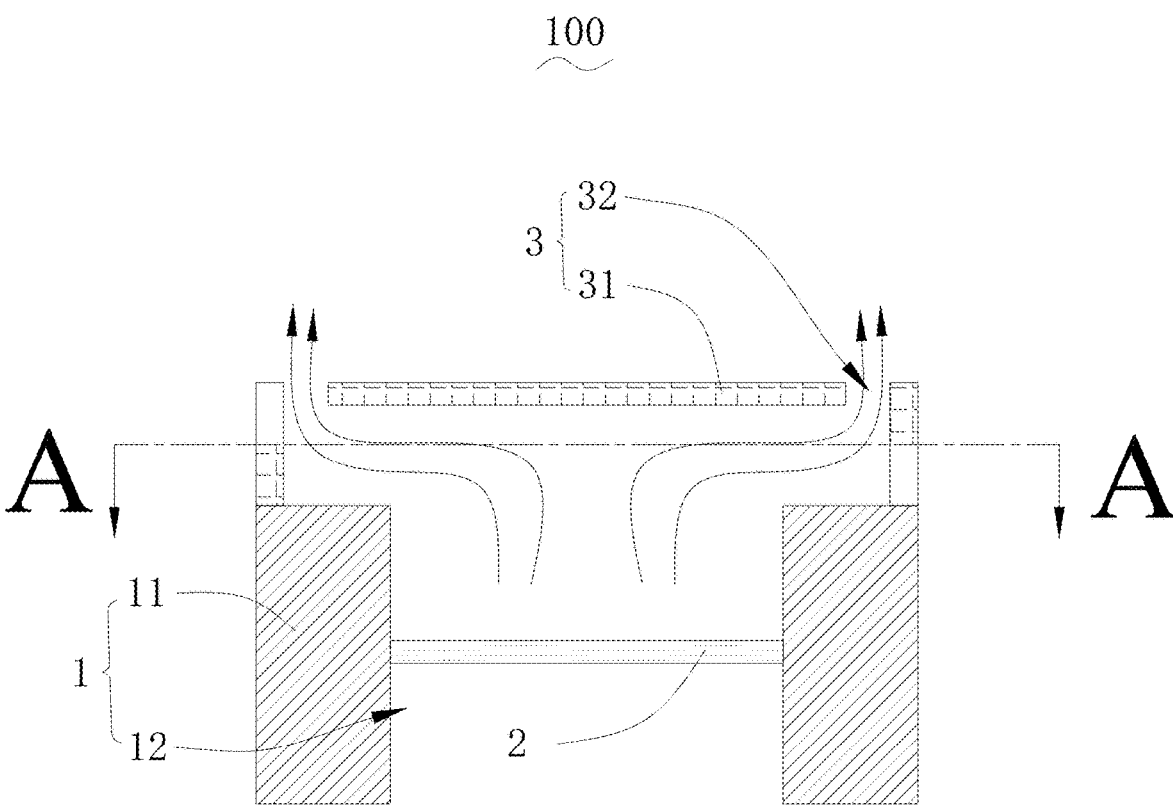
FIG. 6 is a cross-sectional view of a MEMS speaker in accordance with a fifth embodiment of the present disclosure.
Figure 7:
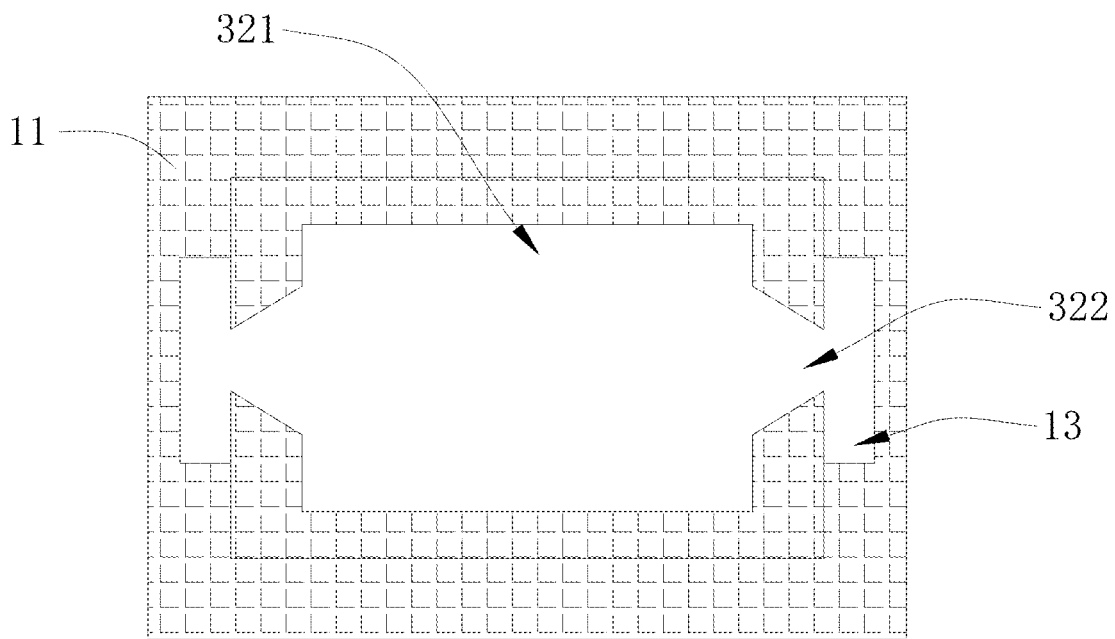
FIG. 7 is a cross-sectional view taken along line A-A in FIG. 6.

As an optional embodiment, as shown in FIG. 6 and FIG. 7, the supporting body 11 is provided with two expansion slots 13 inwardly recessed toward the acoustic valve 3, the two expansion slots 13 are provided opposite to each other. The variable section valve hole 32 includes a main control 321 permeating the valve body 31 and two auxiliary holes 322 permeating from a side of valve body 31 to the main control 321, the two auxiliary holes 322 are communicating with the two expansion slots 13, respectively. A diameter of every one of the two auxiliary holes 322 tapers from one end to the other.

The acoustic valve 3 is located on a side of the diaphragm 2, there is a wall corresponding to a positive outgoing portion which is used for guiding the ultrasonic wave through the acoustic valve 3 and then from the outgoing portion.

The acoustic valve 3 located on the side of the diaphragm 2 (or in the parallel direction of a surface of the diaphragm 2) is simpler in terms of the preparation process, and it is also possible to design and prepare more complex variable section valve hole 3 to improve the demodulation efficiency.

Figure 8:
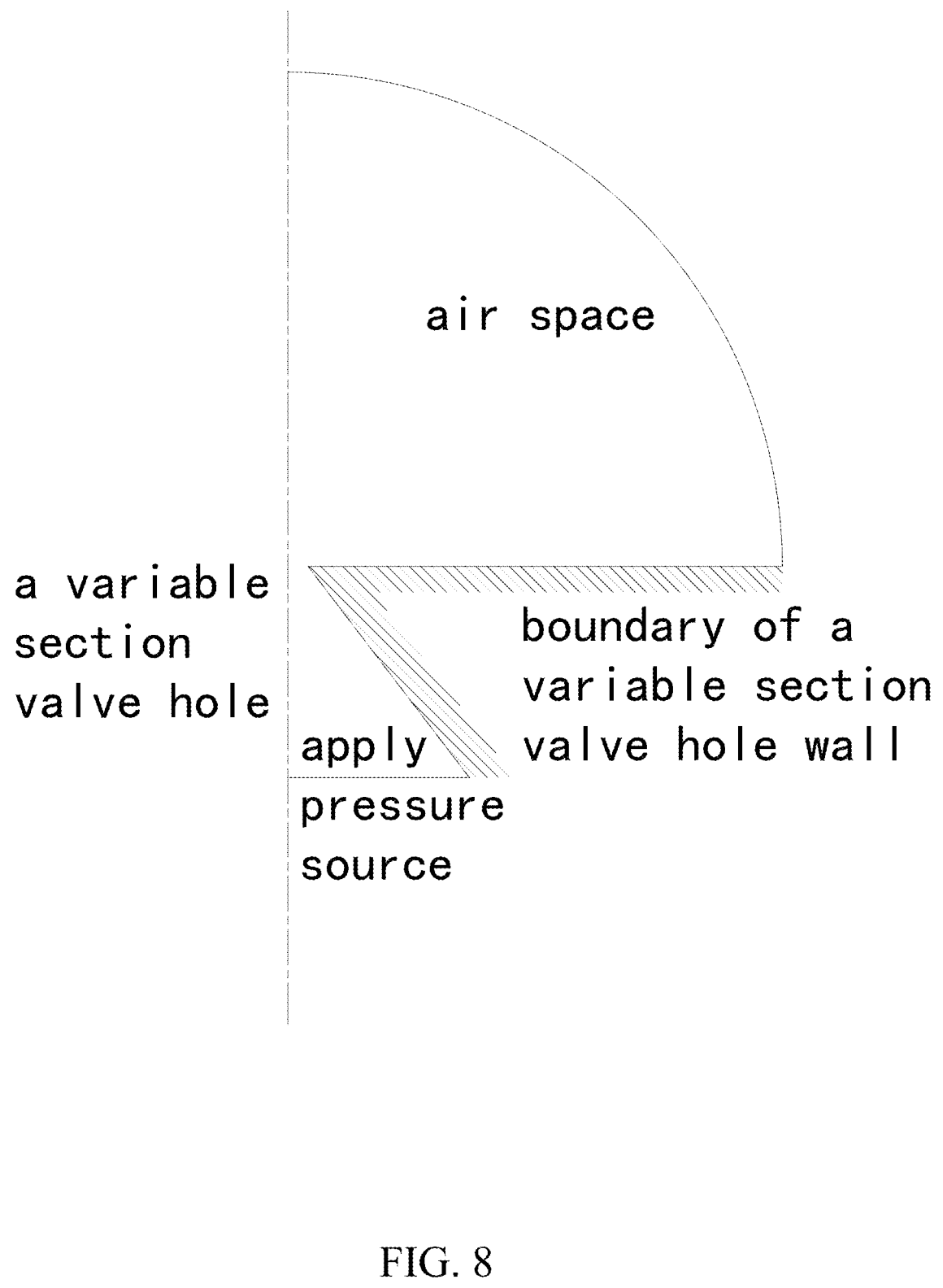
Figure 9:
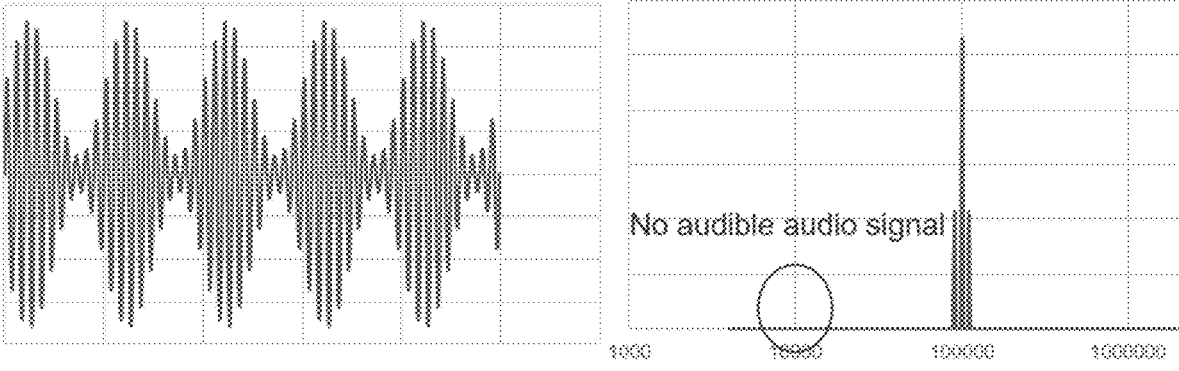
FIG. 9 shows an audio waveform of a large bore in a variable section valve hole with V-shaped in FIG. 8.
Figure 10:
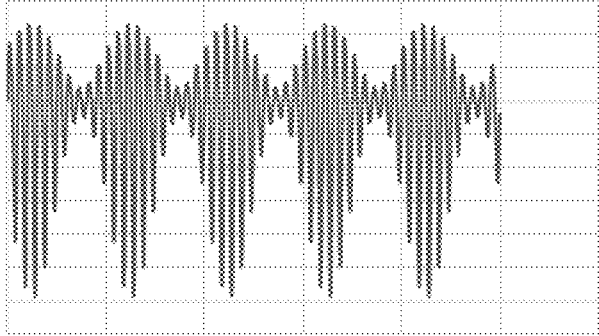
FIG. 10 shows an audio waveform of a small bore in a variable section valve hole with V-shaped in FIG. 8.
Figure 10:
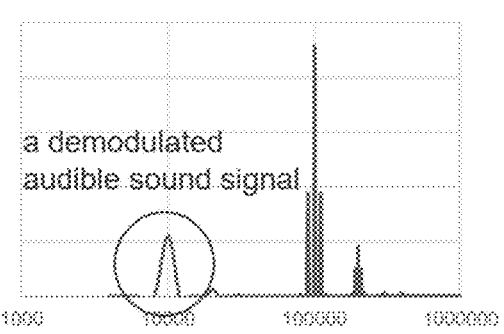

The principle of the MEMS speaker 100 in this embodiment is shown in FIG. 8 with a variable section valve hole 32 in a V-shape structure, P0*(1+sin(2*pi*fa*t))*sin (2*pi*fc*t). As shown in FIG. 9, a modulated ultrasonic pressure source is applied at the large aperture of the variable section valve hole 32 in the V-shaped structure, and this is devoid of audible sound signal, although the envelope is a low-frequency waveform. As shown in FIG. 10, an acoustic pressure waveform extracted close to the small aperture of the variable section valve hole 32 in the V-shaped structure has been created with significant asymmetry, and internally contains audible audio information of the audible sound signal.

The mechanism of operation of the MEMS speaker 100 in this embodiment is that the diaphragm 2 vibrates and emits a substantially symmetrical amplitude-modulated ultrasonic wave, which passes through the acoustic valve 3 and comes out to form an asymmetrical ultrasonic wave, thereby demodulating an audible sound. A same acoustic signal flowing through the variable section valve hole 32 from different directions comes out with significantly different acoustic waves. If the sound wave enters through the large aperture of the variable section valve hole 32 in the V-shaped structure, the sound waves could be converged and thus the sound pressure could be boosted. If the sound wave enters through the small aperture of the variable section valve hole 32 in the V-shaped structure, the sound wave is diffused and thus the sound pressure is reduced. The positive and negative pressures of the symmetrical sound wave emitted by the diaphragm 2 pass through the variable section valve hole 32, which produces an inconsistent effect, thereby creating an asymmetrical sound wave to demodulate an audible sound signal, whereas the V-shaped structure can be set up both positively and negatively, except that the effect on the positive and negative pressures is reversed.

Figure 11:
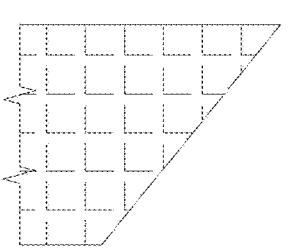
FIG. 11 shows a structural comparison between a variable section valve hole with V-shaped in the present disclosure and a valve hole in the prior art.
Figure 11:
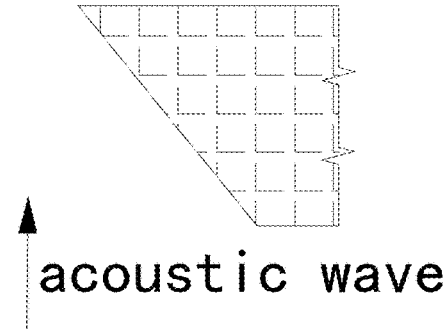
Figure 11:
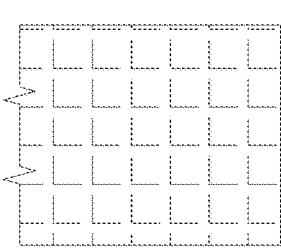
Figure 11:
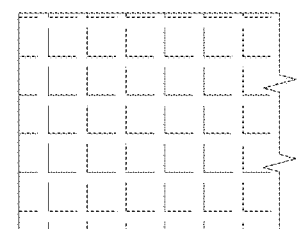
Figure 12:
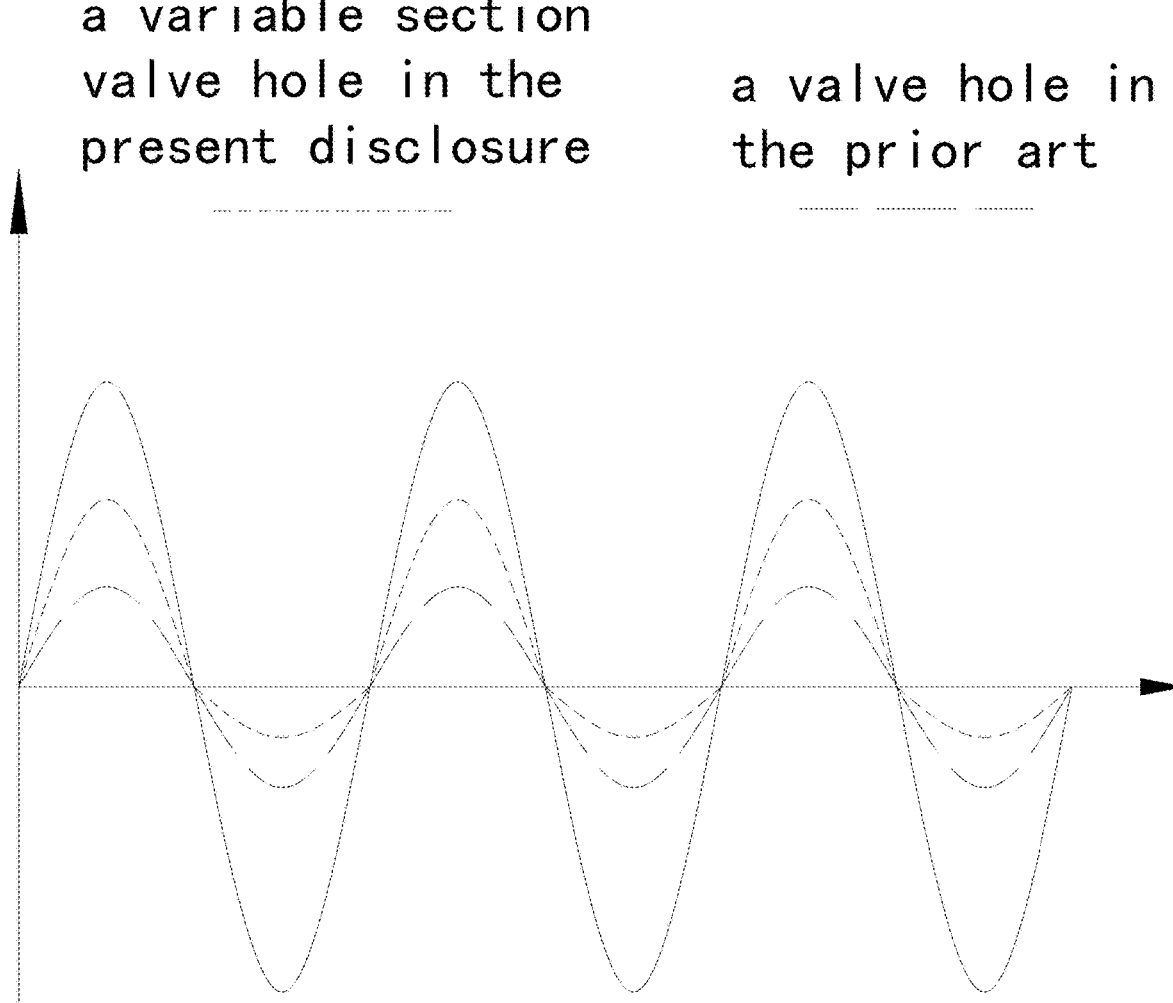
FIG. 12 shows an audio waveform of a variable section valve hole with V-shaped in the present disclosure and a valve hole in the prior art.

As shown in FIG. 11 and FIG. 12, a symmetrical sound wave passing through a normal equal section hole is still a symmetrical sound wave with only the amplitude size changed, whereas the variable section valve hole 32 distorts the acoustic wave, with the result that the amplitude of the positive or negative acoustic wave is greater than that of the other side.

The valve body 31 in the MEMS speaker 100 of the present embodiment is provided the variable section valve hole 32 permeating from one end of the of the valve body 31 to the other end thereof, the variable section valve hole 32 allows the amplitude-modulated ultrasonic wave passing through the variable section valve hole 32 to produce a modulated acoustic wave. Thereby, the acoustic demodulation efficiency and amplitude of the MEMS speaker 100 could be improved, and the acoustic performance of the MEMS speaker 100 could also be improved.

It should be appreciated by those skilled in the art that various modifications are possible without departing from the spirit or scope of the present invention. The embodiments illustrated above should not be interpreted as limits to the present invention, and the scope of the invention is to be determined by reference to the claims that follow.

What is claimed is:

1. A MEMS speaker comprising:
a supporting member comprising a supporting body and an acoustic hole permeating from one end of the supporting body to the other end thereof;
a diaphragm used for emitting an amplitude-modulated ultrasonic wave; and
an acoustic valve comprising a valve body fixed with a peripheral side of the supporting body and located in the acoustic hole and a variable section valve hole permeating from one end of the valve body to the other end thereof; wherein
the diaphragm is fixed with an inner peripheral side of the supporting body and located in the acoustic hole, the variable section valve hole allows the amplitude-modu-lated ultrasonic wave passing through the variable section valve hole to produce a modulated acoustic wave.

2. The MEMS speaker as described in claim 1, wherein an inner diameter of the variable section valve hole changes constantly which makes a bidirectional flow resistance exhibit a non-reciprocal effect.

3. The MEMS speaker as described in claim 2, wherein the non-reciprocal effect of the variable section valve hole makes a symmetrical amplitude-modulated ultrasonic wave passing through the variable section valve hole come out as an asymmetric sound wave, the asymmetric sound wave comprises the modulated acoustic wave.

4. The MEMS speaker as described in claim 2, wherein a cross-sectional shape of the variable section valve hole is a V-shaped structure with an angle of 1°-89°.

5. The MEMS speaker as described in claim 2, wherein the variable section valve hole is in a multi-layer step-type structure.

6. The MEMS speaker as described in claim 2, wherein the variable section valve hole is provided with a curved inner wall.

7. The MEMS speaker as described in claim 2, wherein there are a plurality of acoustic holes, a plurality of dia-phragms and a plurality of acoustic valves, a number of the plurality of acoustic holes is the same as a number of the plurality of the diaphragms and a number of the plurality of the acoustic valves, one of the plurality of the diaphragms is located in each of the acoustic holes, each of the acoustic holes is corresponding with one of the acoustic valves.

8. The MEMS speaker as described in claim 1, wherein there is a plurality of variable section valve holes, the plurality of variable section valve holes is spaced apart from the valve body.

9. The MEMS speaker as described in claim 1, wherein the variable section valve hole is located in a mid-portion of the acoustic hole or at one end of the acoustic hole.

10. The MEMS speaker as described in claim 1, wherein an inlet and outlet acoustic axes of the variable section valve hole is perpendicular to a vibration direction of the dia-phragm.

* * * * *